US006738299B2

United States Patent
Noguchi

(10) Patent No.: US 6,738,299 B2
(45) Date of Patent: May 18, 2004

(54) SEMICONDUCTOR MEMORY DEVICE WITH REDUNDANT MEMORY CELLS

(75) Inventor: Hidekazu Noguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/351,541

(22) Filed: Jan. 27, 2003

(65) Prior Publication Data

US 2003/0169628 A1 Sep. 11, 2003

(30) Foreign Application Priority Data

Jan. 28, 2002 (JP) ........................................ 2002-018793

(51) Int. Cl.[7] ................................................ G11C 7/00
(52) U.S. Cl. ................ 365/200; 365/225.7; 365/230.06
(58) Field of Search .............................. 365/200, 225.6, 365/230.01, 230.06

(56) References Cited

U.S. PATENT DOCUMENTS 5,469,391 A  * 11/1995 Haraguchi ................... 365/200

FOREIGN PATENT DOCUMENTS

JP         11213688 A      6/1999

* cited by examiner

*Primary Examiner*—Thong Q. Le
(74) *Attorney, Agent, or Firm*—Volentine Francos, PLLC

(57) ABSTRACT

A semiconductor memory device includes a redundancy circuit having predecode signal lines, a fuse predecode circuit, fuse decode circuit and an address decode circuit. The fuse predecode circuit is connected to the fuse predecode signal lines. The fuse predecode circuit includes drivers each of which generates a drive signal in response to one of first address signals received by the fuse predecode circuit. The fuse predecode circuit further includes terminal circuits connected to the predecode signal lines for latching signals appeared thereon, and fuse circuits each of which is connected between one of the predecode signal lines and a first potential source. Each of the fuse circuits includes a transistor having a control terminal connected to one of the drivers and a fuse connected to the transistor in series.

17 Claims, 9 Drawing Sheets

SEMICONDUCTOR MEMORY DEVICE WITH REDUNDANT MEMORY CELLS

BACKGROUND OF THE INVENTION

The present invention relates to a semiconductor memory device and, more particularly, to a semiconductor memory device equipped with a circuit configuration for replacing defective memory cells with redundant memory cells.

To compensate for defective memory cells in a semiconductor memory device, there has been known a technique whereby spare memory cells (hereinafter referred to as "redundant cells") are provided in the semiconductor memory device so as to replace a memory cell that has incurred failure with a redundant cell. As a means for substituting a redundant cell for a defective memory cell, an electric circuit (hereinafter referred to as "the redundancy circuit") is usually used.

For example, there is a redundancy system known as "shift redundancy." According to this system, a decoder output terminal is connected to a certain selector line through the intermediary of a switching circuit. If a defective memory cell is found, the connection to the selector line connected with the defective memory cell is shifted to the selector line connected to a non-defective memory cell, and a selection signal is transmitted.

With the progress in the microprocessing technology in the manufacture of semiconductor devices, the trend toward enhanced microprocessing in the manufacture of semiconductor memory devices is accelerating. A redundancy circuit for replacing defective memory cells is an essential part for improving a yield by compensating for defective memory cells, which are inevitably produced during a manufacturing process. However, the size of the fuses suitably used with the redundancy circuit depends on the machining process of a laser, making it virtually difficult to miniaturize the fuse to catch up with the increasing miniaturization of memory cells.

More specifically, in a configuration wherein a plurality of fuses are connected in series, if the pitch of a decoder, that is, the pitch of a memory cell is larger than the pitch of a fuse, then there should be no problem. If, however, the pitch of memory cells become further smaller with the increasing trend toward enhanced microprocessing in the manufacture, the number of the rows of memory cells that can be replaced by one fuse will be two or more. Hence, even when replacing just one row of memory cells would be adequate to compensate for defective memory cells, two or more rows of memory cells would have to be replaced. This would require two or more rows of redundant memory cells be prepared for replacing a single defective memory cell. As a result, the area occupied by the fuses in the redundancy circuit and the area occupied by the increased number of redundant memory cells will lead to a larger chip area.

To access a particular memory cell, an X address thereof is first input, and it is determined whether the memory cell associated with the address need to be replaced by a redundant memory cell, then the X address is defined. Thereafter, a Y address is input, and the Y address is defined, then data is input or output in relation to the memory cell.

Thus, in order to secure a high-speed operation of a semiconductor memory while carrying out redundancy replacement, it is necessary to start the switching for a Y address when an X address is defined, and to complete the switching operation before the Y address is input.

SUMMARY OF THE INVENTION

Accordingly, the present invention may provide a semiconductor memory device equipped with a redundant memory cell for replacing a defective memory cell.

A semiconductor memory device according to the present invention includes a redundancy circuit having predecode signal lines, a fuse predecode circuit, fuse decode circuit and an address decode circuit. The fuse predecode circuit is connected to the fuse predecode signal lines. The fuse predecode circuit includes drivers each of which generates a drive signal in response to one of first address signals received by the fuse predecode circuit. The fuse predecode circuit further includes terminal circuits connected to the predecode signal lines for latching signals appeared thereon, and fuse circuits each of which is connected between one of the predecode signal lines and a first potential source. Each of the fuse circuits includes a transistor having a control terminal connected to one of the drivers and a fuse connected to the transistor in series.

DESCRIPTION OF THE PREFERRED EMBODIMENTS

With reference to the accompanying drawings, embodiments of the semiconductor memory device in accordance with the present invention will be described.

It should be noted that the accompanying drawings merely show the schematic positional relationships among the composing elements to help understand the configuration in accordance with the present invention, and the numerical conditions to be described below should be considered as mere exemplification. The configurations of the circuits in accordance with the present invention are also intended to be mere exemplification, and the present invention should not be limited thereto; other configurations may be used as long as they provide same functions as those provided by the present invention. Obviously, various modifications, improvements, or the like may be added to the configurations by persons skilled in the art upon reference to the description of the invention.

In the redundancy circuit according to the present invention described below, the freedom can be set to four times or more. If the freedom is set, for example, to a 4-fold degree of freedom, an X address signal supplied to the fuse predecode circuit is divided into four address spaces, and the X addresses belonging to the individual address spaces are supplied to their associated X address signal lines, thus permitting more precise redundancy replacement of defective memory cells. The following examples will all have the 4-fold degree of freedom.

Figure 1:
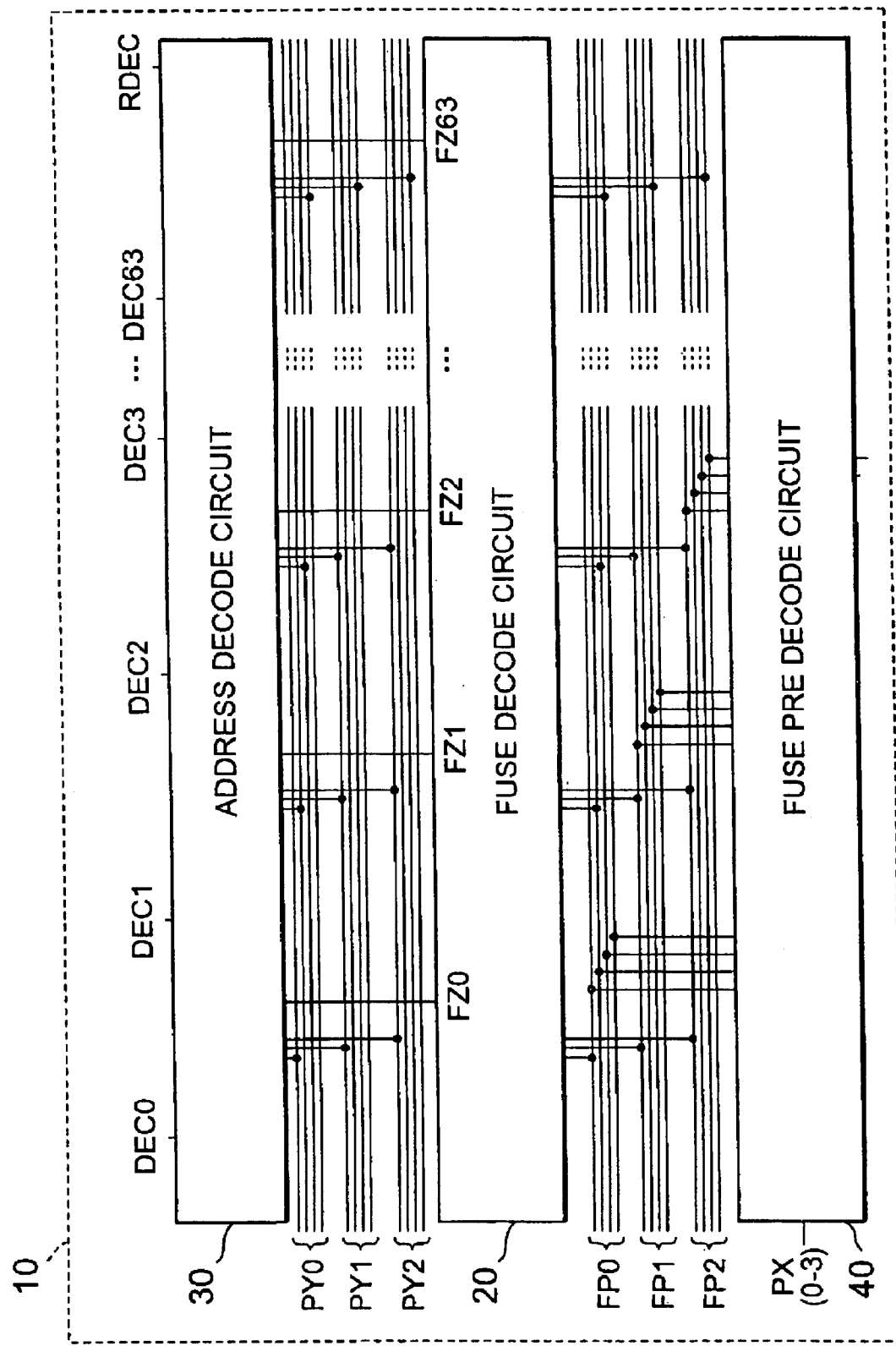
FIG. 1 is a block diagram illustrating the configuration of a redundancy circuit according to a first embodiment.

FIG. 1 is a block diagram illustrating a configuration of a redundancy circuit 10 according to a first example of a first embodiment.

The redundancy circuit 10 according to the first example includes a fuse predecode circuit 40, a fuse decode circuit 20, and an address decode circuit 30.

The redundancy circuit according to the present invention uses a plurality of fuses to constitute a program for redundancy replacement, as in the case of a prior art. The redundancy circuit, however, is characterized in that the rows of the plurality of fuses are disposed on the fuse predecode circuit 40 rather than the fuse decode circuit 20.

First, how these components 40, 20, and 30 are connected will be described.

The X address signal lines PX0, PX1, PX2, and PX3 (hereinafter referred to as "PX (0 through 3)") are connected to the input end of the fuse predecode circuit 40.

Fuse predecode signal lines or buses FP0, FP1, and FP2 (hereinafter referred to as "FP (0 through2)") are connected to the output end of the fuse predecode circuit 40. These FPs (0 through 2) are connected to the input end of the fuse decode circuit 20. In the configuration example shown in the drawing, each of the FP0, FP1, and FP2 is constructed of a bus including four signal lines. Hereinafter, the four signal lines may be indicated by four index numbers of (0) through (3).

Fuse decode signal lines FZ0 through FZ63 are connected between the output end of the fuse decode circuit 20 and the input end of the address decode circuit 30. Connected to the input end of the address decode circuit 30 are Y address signal lines or buses PY0, PY1, and PY2 (hereinafter referred to as "PY (0 through 2)" in some cases) in addition to the fuse decode signal lines FZ. In the configuration example shown in the drawing, each of the PYs (0 through 2) is constructed of a bus including four signal lines. Hereinafter, the four signal lines may be indicated by four index numbers (0) through (3).

Connected to the output end of the address decode circuit 30 are address decode signal lines DEC0 through DEC63 and spare address decode signal lines RDEC.

Figure 2:
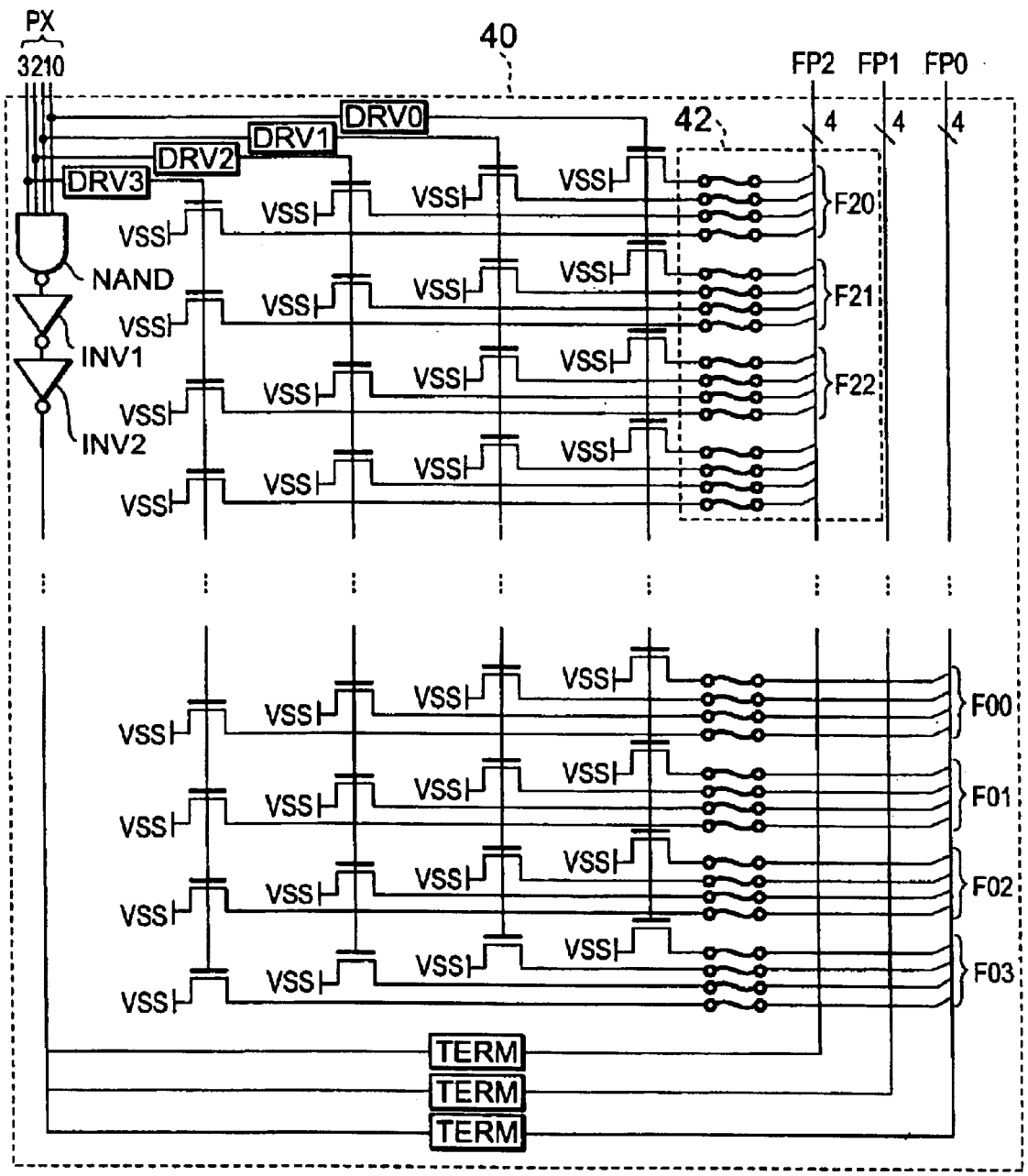
FIG. 2 is a circuit diagram illustrating a configuration example (1) of a fuse predecode circuit according to the first embodiment.

FIG. 2 is a circuit diagram of a configuration example of the fuse predecode circuit 40 ideally used with the redundancy circuit 10 shown in FIG. 1. An example of the circuit configuration of the fuse predecode circuit 40 will be described.

An X address signal line PX is divided into four PX lines (0 through 3) on the basis of the set degree of freedom (4-fold). These X address signal lines PX (0 through 3) are further branched into two directions, one group of four branched lines being connected to the input terminal of a 4-input NAND circuit NAND. The output terminal of the 4-input NAND circuit NAND is connected in parallel to the input terminals of associated terminal circuits TERM for amplifying signals through the intermediary of two inverter circuits INV1 and INV2 arranged in series in this order.

The fuse predecode signal lines or buses FP, namely, the three FP (0 through 2), have four fuse predecode signal lines, the terminal of each signal line being connected to the output terminal of its associated terminal circuit TERM. FIG. 2 shows three terminal circuits TERM, each terminal circuit TERM including four terminal circuits.

Figure 3:
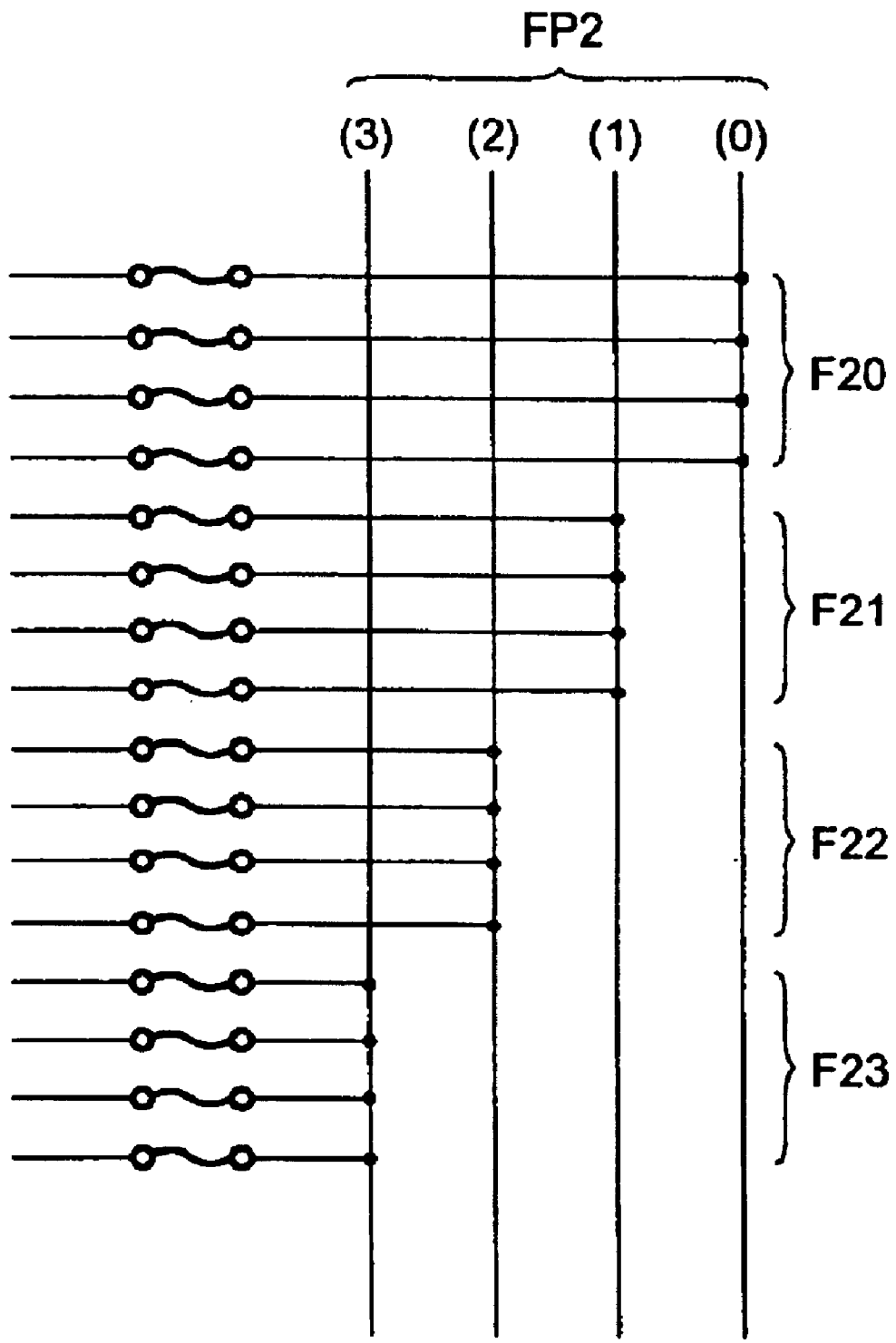
FIG. 3 is a partial enlarged view illustrating the connection between the fuses and the fuse predecode signal lines (buses) FP shown in FIG. 2.

Four series circuits, each having one fuse and one selectable transistor, are connected in parallel between each group of four signal lines constituting each of the fuse predecode signal lines or buses FP (0 through 2) and a reference potential point, e.g., the ground VSS. Referring to FIG. 2, the fuse groups of one set, each group consisting of four fuses, that are connected to each signal line included in the single signal line or bus FP0 are denoted by F00, F01, F02, and F03. Similarly, the groups of fuses for each signal line of the bus FP2 are denoted by F20, F21, F22, and F23, the groups of fuses being included in a bus connection 42. Referring now to FIG. 3, the connective relationship between the fuses and the fuse predecode signal line or bus FP, i.e., the bus connection 42, will be described.

FIG. 3 is a circuit diagram illustrating the details of the connection between the fuses and the fuse predecode signal lines or bus FP in the bus connection 42.

In, for example, the group of fuses F20 consisting of four fuses because of the 4-fold degree of freedom, all the fuses are connected to the fuse predecode signal line FP2 (0). The remaining groups of fuses, each group including four fuses, are connected to one of twelve fuse predecode signal lines FP such that they do not overlap, that is, they are connected in twelve different ways.

These groups of fuses make up rows of fuses F. The aforesaid selectable transistor selects one fuse from the rows of fuses F, and sets the voltage level of the signal line connected to the selected fuse to a predetermined reference level (a VSS level or "L" level in this case).

To selectively drive these selectable transistors, one driver DRV is connected to each group of a plurality of selectable transistors, the transistors being selected one each from each group of fuses (F00 through F23) such that they do not overlap. Specifically, in this configuration example, four sets of selected transistors are formed. The gate electrode of each selected transistor included in a certain set is connected in parallel to the same single driver. Hence, in FIG. 2, drivers DRV0, DRV1, DRV2, and DRV3 are connected so that they are associated with the selected transistor groups of the first set, the second set, the third set, and the fourth set. The plurality of selectable transistors commonly connected to the single driver make up a selectable transistor row. Furthermore, the drivers DRV0 through DRV3 are constituted by, for examples, inverter circuits. Signals from the X address signal lines PX (0 through 3) are supplied to the drivers DRV0 through DRV3 via the four-branched lines on the other side.

Thus, the individual drivers DRV0 through DRV3 are connected to the gate electrodes of the selectable transistor rows disposed such that they are selected to correspond to the degrees of freedom of a defined X address. A driver DRV selected in association with an address space to which the defined X address signal belongs inverts an input signal supplied thereto and applies the signal to the gate electrodes of the selected selectable transistor row.

The aforesaid terminal circuit TERM has a function for latching the potentials of the rows of fuses F and the fuse predecode signal lines or buses FP (0 through 2).

Figure 6:
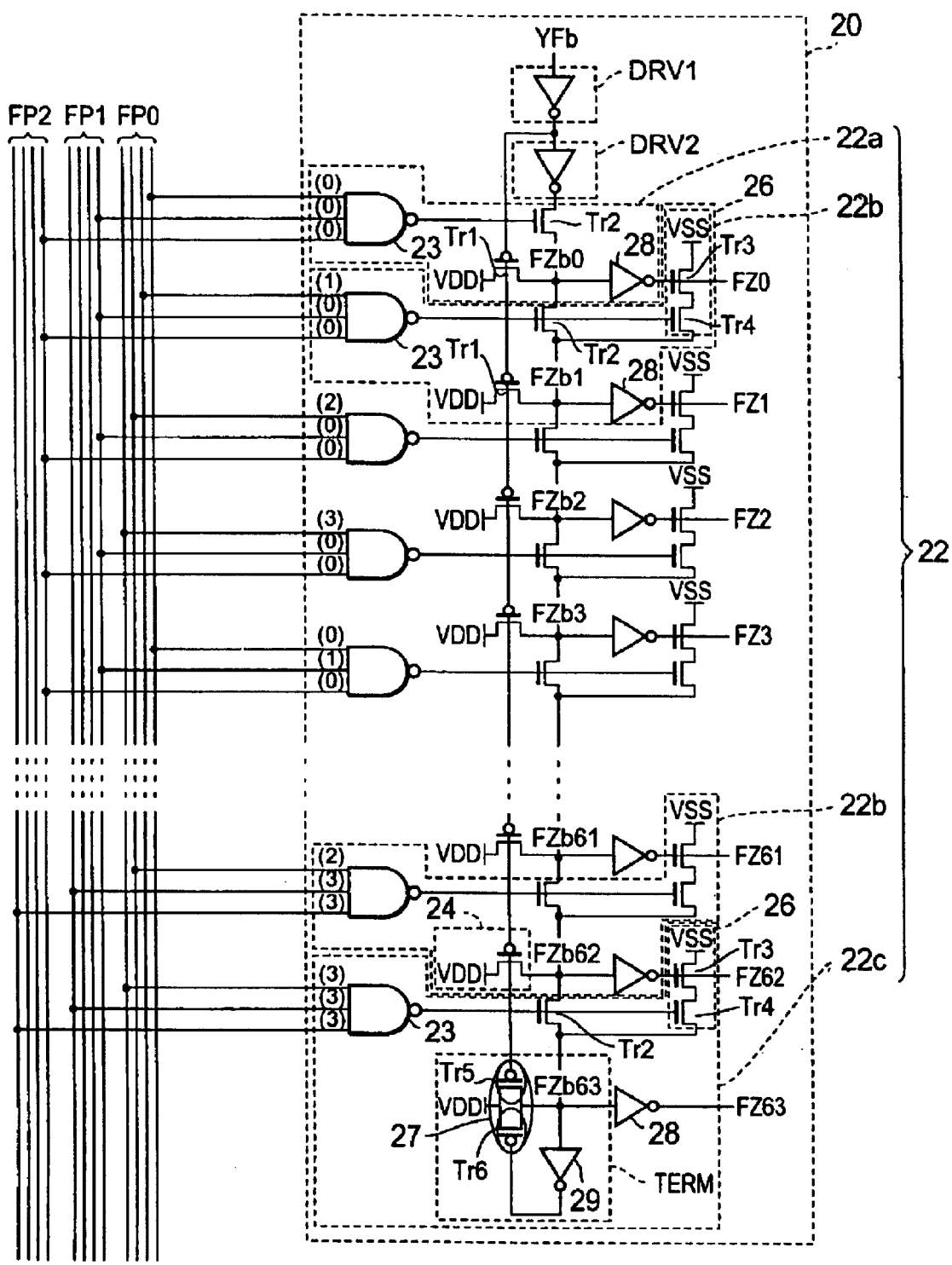
FIG. 6 is a circuit diagram showing configuration example (2) of the fuse decode circuit according to the first embodiment.

The terminal circuit TERM should use the same circuit configuration as that of the terminal circuit TERM described in FIG. 6.

In the configuration according to the embodiment discussed above, the degree of freedom is set to four-fold. In this case, to accomplish 64 different programs, 256 (64×4) fuses are required according to the configuration of the conventional shift redundancy circuit, while only 48 (12×4) fuses are required in the redundancy circuit to which the configuration according to the embodiment has been applied.

Accordingly, the total number of the fuses can be reduced to one fifth or less, as compared with the conventional redundancy circuit. In other words, hitherto, at least the same number of fuses as the number of programs has been required, whereas the number of fuses may be smaller than the required number programs.

Thus, the layout area of the fuse rows F, which has been a major cause for an increased area of a semiconductor memory device, can be also reduced to one fifth or less.

The operation of the fuse predecode circuit 40 of the configuration according to the aforesaid embodiment will now be described.

First, a case where no redundancy replacement takes place will be described. In this case, no fuse F will be cut off.

If a redundancy circuit 10 is inactive, then the voltage levels of the X address signal lines PX (0 through 3) are all retained at high voltage level, H level. The voltage levels of the fuse predecode signal lines FP (0 through 2) are also all retained at the high voltage level, the H level.

When an X address is defined, the voltage level of the signal of one of the X address signal lines PX (0 through 3) is switched from the H level to an L level. This signal is switched to the high voltage level, H level, by one of the drivers DRV0 through DRV3. This causes all the selected transistor rows connected to the driver DRV to be turned ON. Hence, in one fuse group formed of four fuses, one fuse each connected to the selectable transistor row in the ON state is selected and connected to VSS, thereby leading to the L voltage level.

The selectable transistors that belong to a selectable transistor row are connected to one of the individual signal lines of the fuse predecode signal lines FP (0 through 3). Therefore, all voltage levels of the fuse predecode signal lines FP (0 through 3) are changed to the voltage level L of the fuses connected to the aforesaid VSS.

The operation of a redundancy circuit performed to implement redundancy replacement will now be described. The descriptions will be given of an example wherein, of the address decode signal lines DEC0 through DEC63 shown in FIG. 1, the address decode signal line DEC63 is set to unselect, while a spare address decode signal line RDEC is shifted and selected instead.

If the redundancy circuit 10 is inactive, then the X address signal lines PX (0 through 3) and the fuse predecode signal lines FP (0 through 2) are all retained at the H voltage level, as in the foregoing case where no redundancy replacement is carried out.

First, it is assumed that the defined X address signal supplied to the fuse predecode circuit 40 belongs to PX0. A program for avoiding access to a defective memory cell is executed by cutting off fuses. In order to set, for example, the address decode signal line DEC63 shown in FIG. 1 to unselect, three groups of fuses F00, F10, and F20 associated with the selectable transistor rows connected to the X address signal line PX0 via the driver DRV0 are cut off so as to execute the program.

When the X address is defined, causing the voltage level of the X address signal line PX0 to be switched to the L level. This turns ON the selected transistors of the selected transistor row connected to the driver DRV0, causing non-cut-off fuses other than the fuse groups F00, F10, and F20, which have been cut off, to be connected to VSS.

In response to the above, the voltage levels of the fuse predecode signal lines FP0 (0 through 3), FP1 (0 through 3) and FP2 (0 through 3) are switched to the L level. On the other hand, the voltage levels of only the fuse predecode signal lines FP associated with the cut-off fuses F00, F10, and F20, namely, FP0 (3), FP1 (3), and FP2 (3), are maintained at the H level.

The fuse predecode signal FP thus determined and output is supplied to the fuse decode circuit 20 via the fuse predecode signal lines or buses FP0, FP1, and FP2 shown in FIG. 1, and processed in the same manner as in a prior art.

Upon receipt of the fuse predecode signal FP, the fuse decode circuit 20 outputs fuse decode signals FZ, and these signals FZ are supplied to the address decode circuit 30 via the fuse decode signal lines FZ0 through FZ63. In response to the fuse decode signal FZ, the address decode circuit 30 disconnects the address decode signal line DEC (DEC63 in this case) that is set to the unselect state by the foregoing program among the address decode signal lines DEC0 through DEC63, and shifts the connection of the address decode lines DEC in the subsequent stage by one line. As a result, the spare address decode signal line RDEC is selected to replace the unselect address decode signal line so as to use a redundant memory cell.

Figure 4:
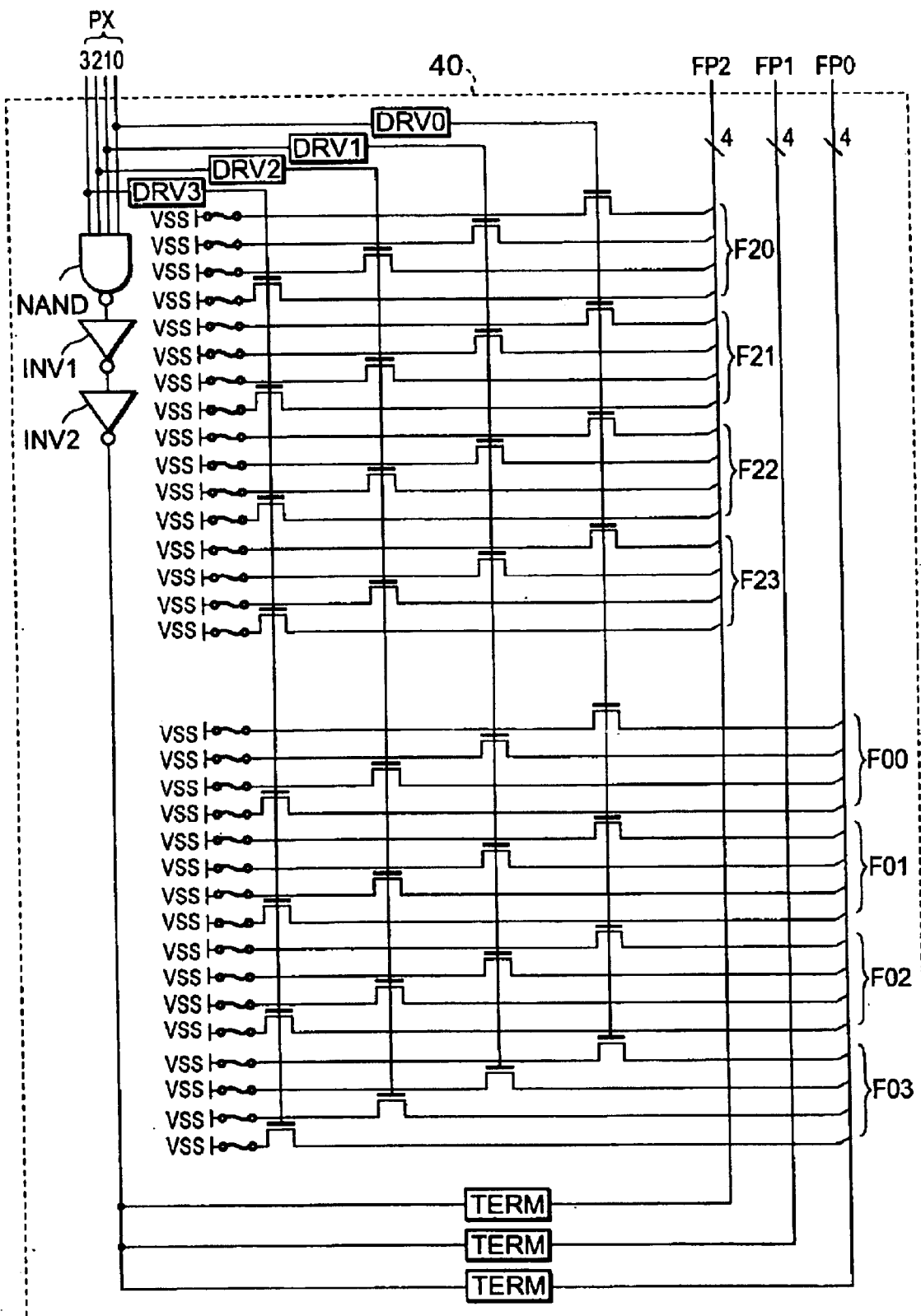
FIG. 4 is a circuit diagram illustrating configuration is example (2) of the fuse predecode circuit according to the first embodiment.

FIG. 4 is a circuit diagram showing a second configuration example of the fuse predecode circuit 40 ideally used with the redundancy circuit 10 shown in FIG. 1. In this embodiment also, the degree of freedom will be set to four-fold as in the case of the first embodiment.

The connection, the positional relationship, and specific circuit configurations of X address signal lines PX (0 through 3), a four-input NAND circuit NAND, two inverter circuits INV1 and INV2, terminal circuits TERM, and fuse predecode signal lines or buses FP (0 through 2) are identical to those of the first embodiment; hence, the descriptions thereof will not be repeated.

The configuration of a second example differs from that of the first example in that the connection sequence of a fuse and a selected transistor in a series circuit is reverse. More specifically, one end of a fuse is connected to the reference potential point VSS, such as the ground, meaning that it is grounded, while the other end thereof is connected to one electrode of a main current path of a selected transistor. The other electrode of the main current path of the selected transistor is connected to a fuse predecode signal line.

According to this configuration, the fuse predecode signals are not affected by the parasitic capacitance of fuses. This example, therefore, provides an advantage of higher speed of fuse predecode signals, in addition to the advantages obtained by the first example.

The operation of the second example is the same as that of the first example, and the descriptions thereof will be omitted.

Figure 5:
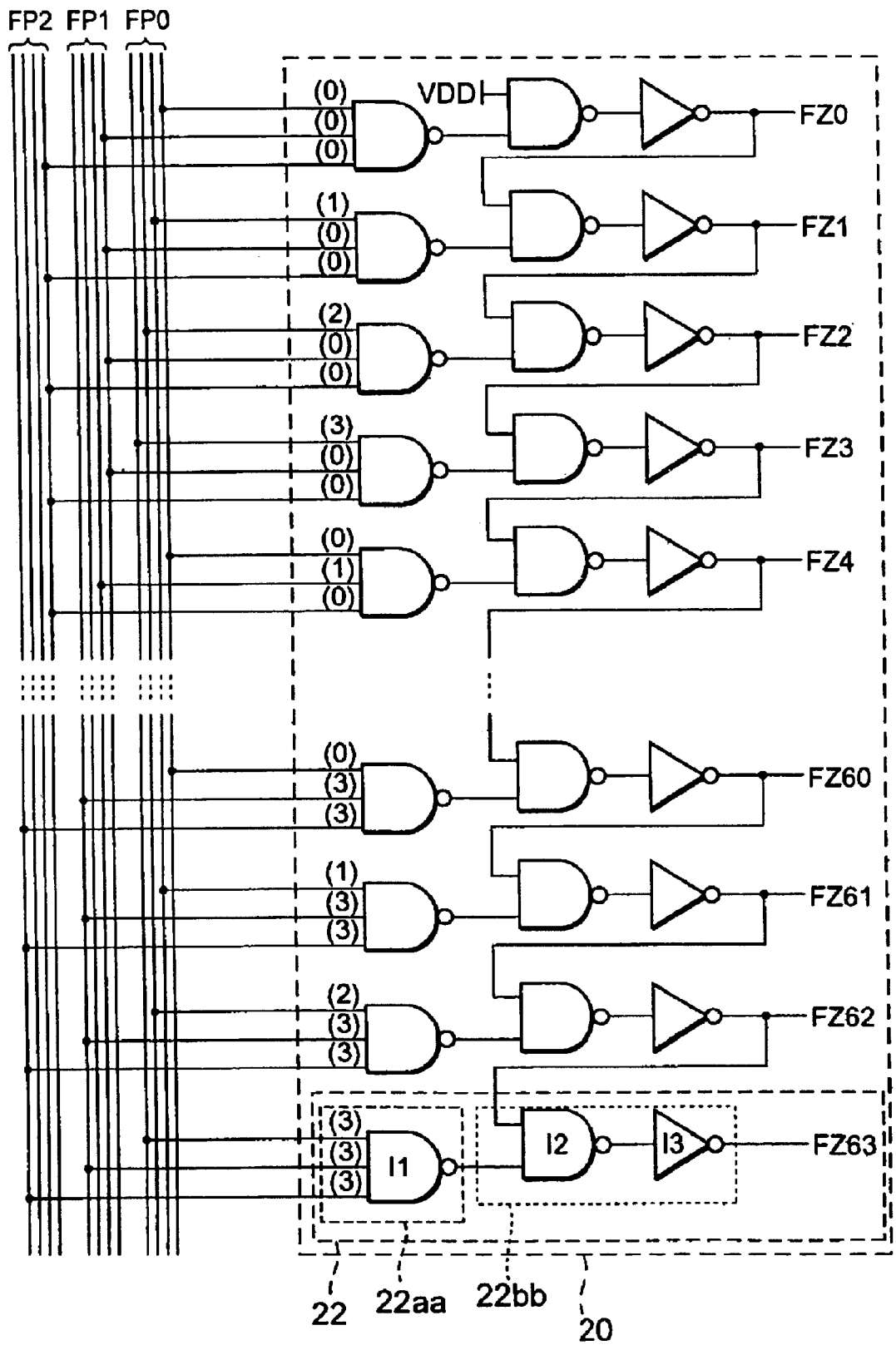
FIG. 5 is a circuit diagram showing configuration example (1) of the fuse decode circuit according to the first embodiment.

FIG. 5 is a circuit diagram illustrating a configuration example of a fuse decode circuit 20 ideally used with the redundancy circuit 10 shown in FIG. 1.

A fuse decode circuit 20 in this example is formed of a plurality of fuse decode signal generating circuits 22. The fuse decode signal generating circuits 22 are constituted by logic combining circuits. A plurality of stages of the fuse decode signal generating circuits 22 are provided, each stage being differently connected to the fuse predecode signal lines FP (0 through 2). In this example, 64 stages of the fuse decode signal generating circuits 22 are provided. Each of the circuits 22 includes a decode circuit 22aa and an output circuit (repeating circuit) 22bb of a fuse decode signal. The decode circuit 22aa is formed of a 3-input NAND circuit (unit circuit: I1). The output circuit 22bb is formed of a series circuit that includes a 2-input NAND circuit (unit circuit: I2) and a NOT circuit (unit circuit: I3).

The three input terminals of the unit circuit I1 are individually connected to different fuse predecode signal lines or buses FP (0 through 2). More specifically, in this example, there are four individual signal lines for each row of buses of the fuse predecode signal lines FP. Specifically, there are three sets of signal lines, each set including four signal lines. Each unit circuit I1 is a NAND circuit having three input terminals. One input terminal is connected to one set of signal lines, so that there are 64 different combinations of the three input terminals to be connected. Accordingly, sixty-four unit circuits I1 are provided. The input terminals of the individual unit circuits I1 are indicated by signs (0), (1), (2), and (3) for designating the fuse predecode signal lines to be connected. The output terminal of each of the unit circuits I1 is connected to one input terminal of the unit circuit I2, which is a 2-input NAND circuit. Connected to the other input terminal of the unit circuit I2 is an output terminal of the fuse decode signal generating circuit 22 of the preceding stage. However, the fuse decode signal generating circuit 22 in a first stage is connected to VDD since it has no adjacent fuse decode signal generating circuit in the preceding stage. The output terminal of the unit circuit I2 is connected to the input terminal of the unit circuit I3. The output terminal of the unit circuit I3 is connected to a fuse decode signal line FZ. In FIG. 5, FZ0 to FZ63 are shown, the fuse decode signal lines of the first stage to a sixty-fourth stage being omitted.

The operation of the fuse decode circuit 20 according to a third example will now be described. First, a case where no redundancy replacement takes place will be described. As already mentioned, if the redundancy circuit is inactive, then the voltage levels of the signals output from a fuse predecode circuit 40 are all high voltage level, H level. The signals are supplied to the decode circuits 22aa, namely, the unit circuits I1 via the fuse predecode signal lines or buses FP (0 through 2). At this time, the output signals from all the unit circuits I1 of a plurality of fuse decode signal generating circuits 22 are set to the L voltage level. Each of the signals is supplied to one input terminal of the unit circuit I2, that is, the 2-input NAND circuit, and an output from the fuse decode signal generating circuit 22 of the preceding stage is supplied to the other input terminal (or a line voltage VDD is supplied in the case of the fuse decode signal generating circuit 22 in the first stage). This causes voltages of the H level to be output from all unit circuits I2 of the plurality of fuse decode signal generating circuits 22. As a result, the output levels of the unit circuits I3, that is, the voltage levels of all fuse decode signal lines FZ0 through FZ63 are switched to the L level.

When an X address is defined and input, the voltage level of the fuse predecode signal lines or buses FP (0 through 3) is switched to the L level, causing the outputs of all unit circuits I1 to be set to the H voltage level. This in turn causes the voltage level of the fuse decode signal line FZ0 in the first stage to be set to the H level. In response to the output of the fuse decode signal line FZ0, the H level voltage is supplied to the unit circuits I2 of the fuse decode signal generating circuits 22 in the following stage, and the H level voltage is also output to the signal line FZ of the following stage. The unit circuits I2 of the fuse decode signal generating circuits 22 in the further subsequent stages receive the outputs, namely, the H level voltage, from the fuse decode signal generating circuits 22 of the preceding stages. As a result, the output voltage levels of all the fuse decode signal lines FZ from the fuse decode signal line FZ0 of the first stage to the fuse decode signal line FZ63 in the last stage are switched to the H voltage level in order like dominoes upon receipt of the signals from adjoining signal lines FZ in preceding stages.

The descriptions will now be given of a case where redundancy replacement is carried out. In this case, the fuse decode signal generating circuit 22 that outputs signals to the signal line FZ63 is taken as an example. In the unit circuit I1, of the individual signal lines (0) through (3) of the fuse predecode signal lines FP (0 through 2), the signal lines FP0 (3), FP1 (3), and FP2 (3) are connected to the input terminals of the decode circuit 22aa. The fuse cutting off program is such that associated fuses of the fuse predecode circuit 40 are cut off.

While the redundancy circuit is inactive, the voltages of the X address signal lines PX (0 through 3) are maintained at the H level. The voltages of the fuse predecode signal lines FP (0 through 2) are maintained at the H level.

Since the fuses have been cut off according to the aforesaid fuse cutting-off program, when an X address is defined, only the signal lines FP0 (3), FP1 (3), and FP2 (3) are selectably maintained at the H voltage level by the fuse predecode circuit 40, while the voltage levels of the signal lines that belong to all the remaining FPs (0 through 2) are set to the L level. In response to the L voltage level, a signal of the L voltage level is output to the fuse decode signal line FZ63. More specifically, if the voltage level of the signal line FZn (n=0 through 63) is set to the L level by the fuse cutting-off program, then the voltage level of FZ (n+1) through FZ63 in the subsequent stages is set to the L level, while the voltage level of the signal lines FZ0 through FZ (n−1) is maintained at the H level.

The fuse decode circuit 20 according to the third example is ideally used in combination with the fuse predecode circuit 40 according to the first or second example. As the whole redundancy circuit 10 in accordance with the present invention, the circuit configuration of an address decode circuit 130 shown in FIG. 10, which has been described in relation to the prior art, should be applied as it is to the address decode circuit 30 shown in FIG. 1. More specifically, the signal lines FZ of the fuse decode circuit 20 should be connected to their corresponding INV2 of column decoders 32 of the address decode circuit 130 shown in FIG. 10.

The specific operation of the address decode circuit 30 is the same as that of the address decode circuit 130 described in relation to the prior art, and the explanation will not be repeated. When a signal of the L voltage level is output only to the fuse decode signal line FZ63 according to the aforesaid fuse cutting-off program, the address decode signal line DEC63 of the address decode circuit 30 is unselected and removed. In place of DEC63, a signal line RDEC is selected so that the redundant memory cell connected to the signal line RDEC is used instead of the memory cell (defective memory cell) connected to DEC63. More specifically, if a signal of the L voltage level is output to a fuse decode signal line FZn of an n-th stage, causing the voltage level of the signal lines FZn through FZ63 to be set to the L level, as described above, then the electrical connection of the column decoders 32 is sequentially shifted to the following stages so as to unselect an address decode signal line DECn of the n-th stage, and the connection of address decode signal lines DEC (n+1) through DEC63 in a subsequent stage, the (n+1)th stage, is shifted by one until the spare address decode signal line RDEC is finally connected.

The configuration makes it possible to efficiently convert a fuse predecode signal output from the fuse predecode circuit 40 according to the first or second example into a fuse decode signal. Moreover, the fuse decode circuit 20 in accordance with the present invention does not include fuses, allowing a miniaturization manufacturing process to be used to successfully cope with even smaller pitches of memory cells achieved by further progress in the processing technology.

FIG. 6 is a circuit diagram showing a configuration example of another fuse decode circuit 20 ideally used with the redundancy circuit 10 shown in FIG. 1.

A fuse decode circuit 20 in this configuration example is equipped with as many stages of a fuse decode signal generating circuit 22 as fuses. The fuse decode signal generating circuit 22 is provided in a first stage 22a, an intermediate stage 22b, and a last stage 22c. In the intermediate stage 22b of the fuse decode signal generating circuit 22, a plurality of stages shares the same circuit configuration. In the configuration according to the example, the number of the fuses is set to 64, so that the intermediate stage 22b has 62 stages.

The fuse decode circuit 20 is further provided with a first driver circuit DRV1 formed of a NOT circuit whose input terminal is connected to a Y driver input signal line YFb of a memory cell array that includes basic or regular memory cells and redundant memory cells added thereto, and a second driver circuit DRV2 formed of a NOT circuit that is connected to an output terminal of the driver circuit DRV1. Hence, the outputs of the first driver circuit DRV1 provide the inverted signals of the Y driver input signals. The outputs of the second driver circuit DRV2 are further inverted to be Y driver input signals.

As it will be understood from the descriptions to be given hereinafter, the fuse decode circuit 20 is provided with first, second, third, fourth, fifth, and sixth transistors Tr1, Tr2, Tr3, Tr4, Tr5, and Tr6.

The first stage 22a of the fuse decode signal generating circuit 22 includes a 3-input NAND circuit 23 as a decode circuit of the first stage, a p-channel transistor Tr1 of the first stage, an n-channel transistor Tr2 of the first stage, and an inverter circuit 28 of the first stage. The gate electrode of the n-channel transistor Tr2 of the first stage is connected to the output terminal of the 3-input NAND circuit 23 of the first stage, and one end of a main current path is connected to the output terminal of a second driver circuit DRV2. The p-channel transistor Tr1 of the first stage has its gate electrode connected to the connection midpoint of the first and second driver circuits DRV1 and DRV2, and its main current path connected between the terminal of the line voltage (VDD) and the other end of the main current path of the n-channel transistor Tr2 of the first stage. The inverter circuit 28 of the first stage has its input terminal connected to a connection midpoint FZb0 of the first stage between the p-channel transistor Tr1 of the first stage and the n-channel transistor Tr2 of the first stage. The inverter circuit 28 is formed of a NOT circuit that issues a fuse decode signal of the first stage from its output terminal.

The input terminals of the 3-input NAND circuit 23 are respectively connected to individual fuse predecode signal lines FP0, FP1, and FP2.

The intermediate stage 22b positioned in the second stage of the fuse decode signal generating circuit 22 has a circuit configuration similar to the circuit configuration of the first stage 22a, and further includes a series circuit 26 formed of two n-channel transistors Tr3 and Tr4 of the second stage. The main current paths of the n-channel transistors Tr3 and Tr4 of the second stage are connected in series between a connection midpoint FZb1 of the second stage between the n-channel transistor Tr2 of the second stage and the p-channel transistor Tr1 of the second stage and the terminal of a ground potential (VSS), which is a reference potential point.

One end of the electrode of the main current path of the n-channel transistor Tr2 of the second stage is connected to the other end of the electrode of the main current path of the n-channel transistor Tr2 of the first stage. The output terminal of the intermediate stage 22b of the second stage of the fuse decode signal generating circuit 22 provides the output terminal of the inverter 28 of the second stage.

The circuit configurations of all the intermediate stages 22b from the third stage to the 63rd stage of the fuse decode signal generating circuit 22 are the same as the circuit configuration of the second stage described above. Hence, the circuit configuration of the intermediate stage 22b is repeated. The main current paths of the n-channel transistors Tr2 of the first stage 22a, the intermediate stage 22b, and the last stage 22c are connected in series. The output terminals of the inverter circuits 28 of the intermediate stages 22b provide output terminals FZ1 through FZ62 of the fuse decode signals of the individual stages.

As in the case of the first stage 22a and the intermediate stage 22b, the last stage 22c of the fuse decode signal generating circuit 22 is equipped with the 3-input NAND circuit 23, the n-channel transistor Tr2, the inverter circuit 28, the series circuit 26 of the n-channel transistors Tr3 and Tr4, and the last-stage terminal circuit TERM.

The last-stage terminal circuit TERM includes a transistor parallel circuit 27 and another inverter circuit 29 formed of a NOT circuit. In the transistor parallel circuit 27, the main current paths of the two p-channel transistors Tr5 and Tr6 of the last stage is connected between the line voltage (VDD) terminal and the input terminal of the inverter circuit 29. The gate electrode of one transistor Tr5 of the transistor parallel circuit 27 is connected to the connection midpoint of the first and second driver circuits DRV1 and DRV2. The gate electrode of the other transistor Tr6 is connected to the output terminal of the other inverter circuit 29.

Furthermore, in the last stage 22c of the fuse decode signal generating circuit 22, the output terminal of the 3-input NAND circuit 23 is connected to the gate electrode of the n-channel transistor Tr2 of the last stage 22c and also to the gate electrode of the n-channel transistor Tr4 of the last stage 22c. As in the case of the series circuit 26 of the intermediate stage 22b, one end of the series circuit 26 of the last stage 22c is connected to the terminal of the ground potential (VSS), while the other end thereof is connected to the transistor Tr2, the transistor parallel circuit 27, and a connection midpoint FZb63 between the two inverter circuits 28 and 29 of the last stage 22c.

The output terminal FZ63 of the inverter circuit 28 of the last stage 22c constitutes a terminal for outputting fuse decode signals of the last stage.

Furthermore, one end of the n-channel transistor Tr2 of the last stage 22c is connected to the connection midpoint FZb62 of the preceding stage, namely, the 63rd stage.

The gate electrodes of the p-channel transistors Tr1 of the intermediate stage 22b and the p-channel transistor Tr5 of the last stage 22c, which have been described above, are connected in parallel to the connection midpoint between the two driver circuits DRV1 and DRV2.

The first through third input terminals of the 3-input NAND circuits (decode circuits) 23 included in the aforesaid intermediate stage 22b and the last stage 22c are connected to the fuse predecode signal lines or buses FP0, FP1, and FP2, respectively. The 3-input NAND circuits 23 from the first stage 22a to the last stage 22c have different connection forms of the three input terminals and the fuse predecode signal lines or buses FP0, FP1, and FP2. More specifically, according to the configuration, four fuse predecode signal lines make up one set of buses, and three sets of buses FP0, FP1, and FP2 are included. The first input terminals of the 3-input NAND circuits 23 are connected to one of the signal lines of the bus of the first set, the second input terminals are connected to one of the signal lines of the bus of the is second set, and the third input terminals are connected to one of the signal lines of the bus of the third set. At least one input terminal of the 3-input NAND circuit 23 of a certain stage and at least one input terminal of the 3-input NAND circuit 23 of another stage are connected to different fuse predecode signal lines Fb through a bus. Referring to FIG. 6, the four signal lines of each of the buses FP0, FP1, and FP2 are numbered (0), (1), (2), and (3), and these numbers are assigned to the input terminals of the 3-input NAND circuits 23 to indicate a connection state.

The operation of a fuse decode circuit 20 according to a fourth example will now be described. First, the descriptions will be given of a case where no redundancy replacement is carried out. If the redundancy circuit is inactive, the signals supplied from a Y driver input signal line YFb to the driver DRV1 and the signals output from the fuse predecode circuit 40 are all at the H voltage level. Hence, all the fuse decode signal generating circuits 22 from the first stage to the last stage output signals at the L voltage level. Therefore, the n-channel transistors Tr2 connected to the stages of the fuse decode signal generating circuit 22 are turned OFF, while the p-channel transistor Tr1 connected to the driver DRV1 is turned ON. This causes all connection midpoints FZb (0 through 63) of the series circuit 26 connected to the transistor Tr1 to be precharged to the H voltage level by a precharge circuit 24. As a result, all fuse decode signal lines FZ (0 through 63) from the first stage to the last stage are set to the L voltage level.

When an X address is defined, the voltage level of the Y driver input signal line YFb is set to the L level, and the voltage levels of the fuse predecode signal lines or buses FP (0 through 2) are set to the L level. This causes the voltage level of the connection midpoint FZb0 to the L level, while the voltage level of the fuse decode signal line FZ0 to the H level. Since the outputs of the 3-input NAND circuit 23 are all at the H voltage level, the transistor Tr2 and the transistor Tr4 are turned ON. Hence, the connection midpoint FZb1 of the fuse decode signal generating circuit 22 adjacent to the subsequent stage is lowered to the L voltage level of the connection midpoint FZb0 and the reference voltage (the ground voltage) VSS of the series circuit 26 until it reaches the L level, so that the signal line FZ1 is switched to the H voltage level. Similarly, the outputs to all the fuse decode signal lines FZ up to the signal line FZ63 of the last stage are reversed to the H voltage level by a domino effect in order from the signal line FZ0.

The descriptions will now be given of a case where redundancy replacement is carried out. In this example, the signal line FZ63 will be selected. Connected to the 3-input NAND circuit 23 of the last stage 22c are the signal lines FP0 (3), FP1 (3), and FP2 (3) among the individual signal lines (0) through (3) of the fuse predecode signal lines FP (0 through 2). It is assumed that the fuse of the associated fuse predecode circuit 40 has been cut off such that the FZ63 is selected. When an X address is defined, the voltage level of the Y driver input signal line YFb is set to the L level, and the 3-input NAND circuits 23 excluding the last stage 22c of the fuse decode signal generating circuit 22 output signals of the H voltage level. This causes the voltage level of the connection midpoint FZb0 to the L level, while the voltage level of the fuse decode signal line FZ0 to the H level. As a result, the transistors Tr2 and the transistor Tr3 are turned ON. Hence, the connection midpoint FZb1 of the fuse decode signal generating circuit 22 adjacent to the subsequent stage is lowered to the L voltage level of the connection midpoint FZb0 and the reference voltage VSS of the series circuit 26 until it reaches the L level, so that the fuse decode signal line FZ1 is switched to the H voltage level. Similarly, the outputs to the fuse decode signal lines FZ up to the signal line FZ62 are reversed to the H voltage level by a domino effect in order from the signal line FZ0.

When the voltage levels of the fuse predecode signal lines FP0 (3), FP1 (3), and FP2 (3) are all set to the H level by the foregoing fuse cutting-off program, the transistor Tr4 that provides outputs to the transistor Tr2 and the fuse decode signal line FZ62 in the last stage 22c is turned OFF so as to electrically isolate the connection midpoint FZb63 connected to the transistor Tr4. The isolated connection midpoint FZb63 is latched by the terminal circuit TERM and its voltage level is switched to the H level, so that a voltage signal of the L level is issued only to the signal line FZ63 in the last stage.

Figure 10:
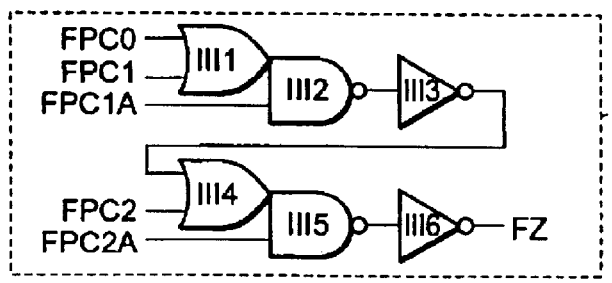
FIG. 10 is a circuit diagram providing an enlarged view of a signal generator shown in FIG. 9.

More specifically, if a voltage signal of the L level is output to the fuse decode signal line FZn of, for example, an n-th stage, causing the voltage levels of the signal lines FZ (n+1) through FZ63 to be switched to the L level in sequence, as described above, then the electrical connection of the column decoder 32 shown in, for example, FIG. 10 is shifted. This unselects an address decode signal line DECn, and the connection of the column decoders 32 and the address decode signal lines DEC (n+1) through DEC63 in the subsequent stages thereafter is shifted by one. As a result, the spare address decode signal line RDEC is selected.

The fuse decode circuit 20 according to the fourth example is ideally used in combination with the fuse predecode circuit 40 according to the first or second example. The circuit configuration of the address decode circuit 130 shown in FIG. 10, which has been described in relation to the prior art, should be applied to the address decode circuit 30 connected to the fuse decode circuit 20 according to the fourth example, as in the case of the third example. More specifically, the fuse decode signal lines FZ of the fuse decode circuit 20 should be connected to their corresponding INV2 of column decoders 32 of the address decode circuit 130 shown in FIG. 10.

The operation of the address decode circuit 30 has been described in relation to the foregoing third example and the prior art; hence, the description will not be repeated.

The configuration according to the fourth example provides an advantage of a relatively higher operation speed in addition to the advantages obtained by applying the fuse decode circuit according to the third example. More specifically, operating the fuse decode circuit according to the third example requires a signal transmission time for two elements per fuse decode signal generating circuit 22, while the fuse decode circuit according to the fourth example requires the signal transmission time for one transistor per fuse decode signal generating circuit 22 to complete its operation.

In the exemplary configuration according to the first example, the degree of freedom has been set to 4, so that the number of the X address signal lines to which the redundancy circuit is connected has been set to N=4. The number N of the X address signal lines, however, is not limited to 4 according to the configurations of the present invention; the number N may be easily increased, as necessary. For instance, if the number of the X address signal lines is set to N (N being a positive integer) on the basis of a set degree of freedom, then the number of the driver circuits may be set to N, the number of the foregoing fuse predecode signal lines may be set to 3N, and the number of the foregoing terminal circuits may be set to 3N.

Figure 7:
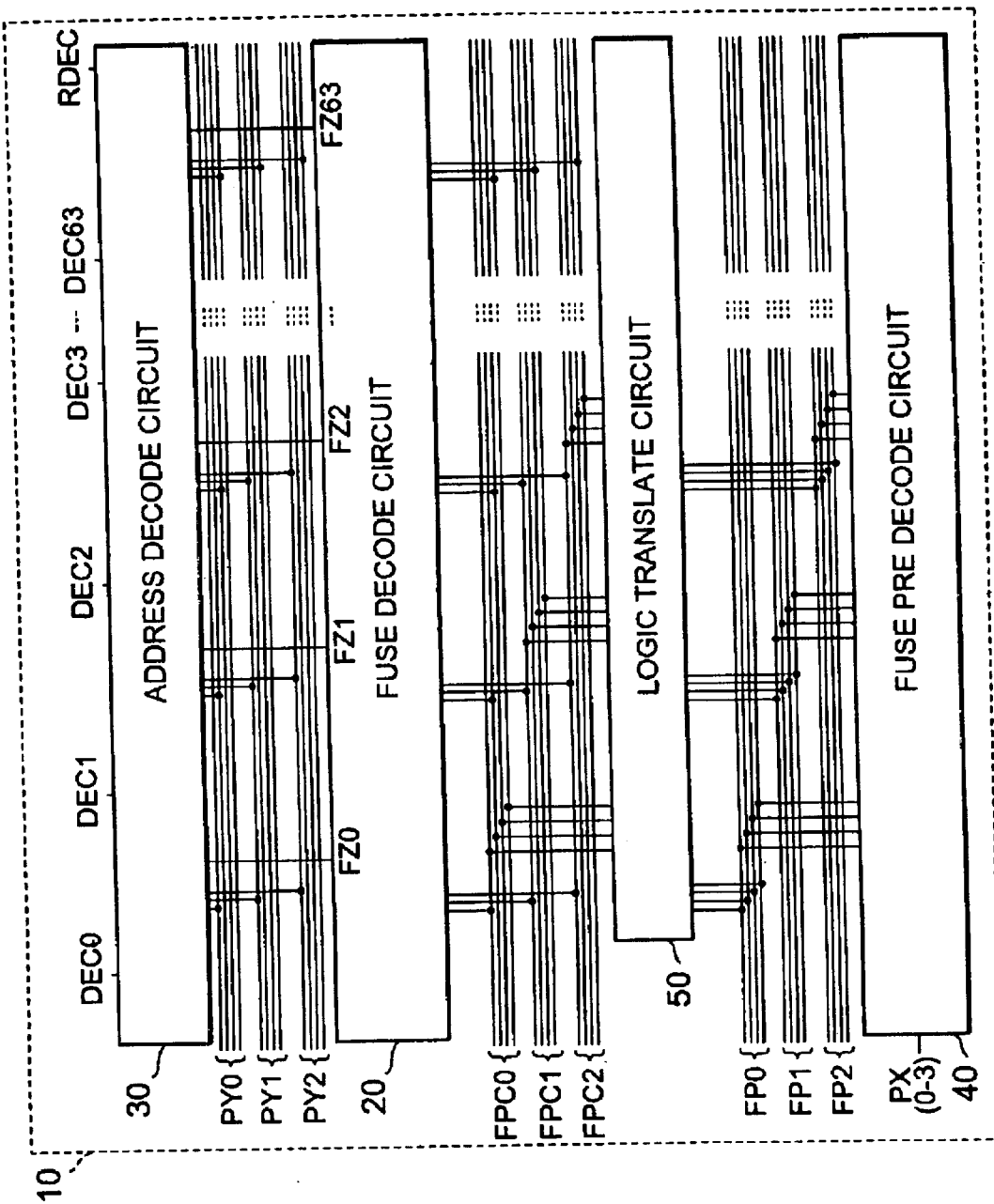
FIG. 7 is a block diagram illustrating a configuration of a redundancy circuit according to a second embodiment.

FIG. 7 is a block diagram illustrating the configuration of a redundancy circuit of a second embodiment in accordance with the present invention.

A redundancy circuit 10 in accordance with the second embodiment includes the fuse predecode circuit 40, the fuse decode circuit 20, and the address decode circuit 30 of the first embodiment, and further includes a logic translate circuit 50 for logically translating the signals output from a fuse predecode circuit 40 and supplying the results to a fuse decode circuit 20.

In the redundancy circuit 10 according to this embodiment, the circuit configuration described in relation to the prior art should be applied to the address decode circuit 30. Furthermore, one of the circuit configurations described with reference to FIGS. 2, 3, and 4 in the first or second example of the first embodiment should be applied to the fuse predecode circuit 40. Since the configurations and operations have already been described, no further detailed descriptions will be given.

The following will describe an exemplary configuration of the logic translate circuit 50 according to the embodiment and an exemplary configuration of the fuse decode circuit 20 that has a characteristic configuration to match the configuration of the logic translate circuit 50.

As in the case of the first embodiment discussed above, the number of the X address signal lines may be set to N according to a set degree of freedom. In the following description, the number N will be set to 4 (N=4). X address signal lines PX (0 through 3) are connected to the input terminals of the fuse predecode circuit 40. Connected to the output terminal of the fuse predecode circuit 40 are fuse predecode signal lines or buses FP (0 through 2). The fuse predecode signal lines or buses FP (0 through 2) are connected to the input terminal of the logic translate circuit 50. Connected to the output terminal of the logic translate circuit 50 are the fuse predecode logic translate signal lines or buses FPC0, FPC1, and FPC2 (hereinafter referred to as FPC (0 through 2)). Furthermore, the fuse predecode logic translate signal lines or buses FPC (0 through 2) are connected to the input terminal of the fuse decode circuit 20. One end of each of fuse decode signal lines FZ0 through FZ63 is connected to the output terminal of the fuse decode circuit 20, and the other end of each of these signal lines FZ0 through FZ63 is connected to the input terminal of the address decode circuit 30. Connected to the input terminal of the address decode circuit 30, which is different from the one for the fuse decode signal lines FZ, are Y address signal lines or buses PY (0 through 2).

The operation of the redundancy circuit 10 according to the second embodiment will now be explained.

In this example also, the degree of freedom is set to 4. The X address signal line is slit into four lines, that is, into four address spaces. An X address signal is allotted to one of X address signal lines PX (0 through 3), and supplied to the fuse predecode circuit 40 wherein it is defined. A fuse predecode signal FP generated in the fuse predecode circuit 40 is output to a fuse predecode signal line or bus FP (0 to 2) that connects the fuse predecode circuit 40 and the logic translate circuit 50.

The output fuse predecode signal is supplied from a signal line or bus FP (0 to 2) to the logic translate circuit 50. Then, the fuse predecode logic translate signal, which has been logically translated in the logic translate circuit 50, is supplied to the fuse decode circuit 20 via a fuse predecode logic translate signal line FPC (0 to 2). The fuse decode circuit 20 supplies a fuse decode signal FZ for switching the connection of column decoders in the address decode circuit 30 to the address decode circuit 30 via a fuse decode signal line FZ (0 to 63) connected to the address decode circuit 30.

The address decode circuit 30 outputs signals for implementing redundancy replacement by shifting the connection of the 64 address decode signal lines DEC (0 through 63) from a first stage to a last stage and a spare address decode signal line RDEC.

Figure 8:
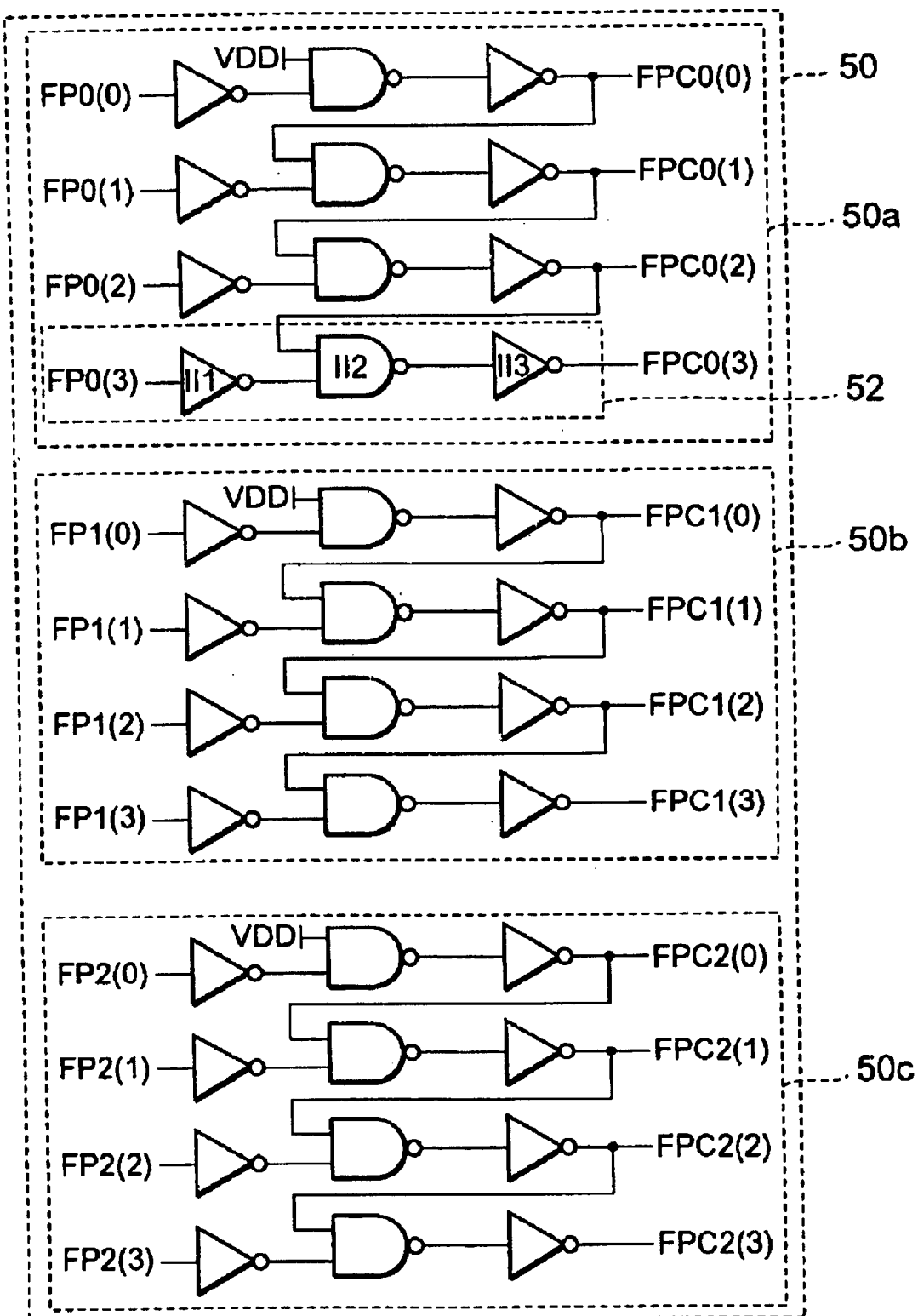
FIG. 8 is a circuit diagram illustrating a configuration example of a logic translate circuit according to the second embodiment.

FIG. 8 is a circuit diagram showing a configuration example of the logic translate circuit 50 ideally used with the redundancy circuit 10 shown in FIG. 7. The logic translate circuit 50 includes a first logic translate circuit block 50a that receives the signals of the fuse predecode signal line or bus FP0 and outputs four signals of fuse predecode logic translate signals FPC0 (0 through 3), a second logic translate circuit block 50b that receives the signals of the signal line or bus FP1 and outputs four signals of the fuse predecode logic translate signals FPC1 (0 through 3), and a third logic translate circuit block 50c that receives the signals of the signal line or bus FP2 and outputs four signals of fuse predecode logic translate signals FPC2 (0 through 3). Each of these logic translates circuit bocks 50a, 50b, and 50c includes repetition of units of four, that is, a logic translate circuit 52 formed of four stages, namely, from a first stage to a last stage. The logic translate circuit 52 includes a first inverter circuit II1 having a fuse predecode signal line or bus FP connected to its input terminal, a 2-input NAND circuit II2 in which the output terminal of the inverter circuit II1 and the output terminal (or a power terminal VDD if there is no logic translate circuit 52 in the preceding stage) of the logic translate circuit 52 adjacent to the preceding stage are connected to the input terminal thereof, and a second inverter circuit II3 in which the output terminal of the 2-input NAND circuit II2 is connected to the input terminal thereof and which outputs a fuse predecode logic translate signal FPC corresponding to the fuse predecode signal FP supplied to the first inverter circuit II1 from the output terminal thereof. The last stages of the logic translate blocks 50a, 50b, and 50c, i.e., the output terminals of the logic translate circuits 52 of the fourth stages, are not connected to the input terminals of the 2-input NAND circuits II2 of the logic translate circuits of any subsequent blocks. In other words, the fuse predecode signals FP (0 through 2) supplied to the logic translate circuit blocks 50a, 50b, and 50c are independently subjected to logic translation in the individual blocks.

The descriptions will now be given of the operation of the logic translate circuit block 50a when, for example, the redundancy circuit 10 is inactive. In this case, all the supplied fuse predecode signals FP0 (0 through 3) are at the H voltage level (corresponding to the line voltage level VDD), as in the case of the first embodiment. Hence, the output signals of the first inverter circuits II1 of the individual stages of the logic translate circuits 52 of the logic translate circuit blocks 50a, 50b, and 50c are all at the L voltage level (corresponding to the reference voltage level VSS). Thus, all the outputs of the 2-input NAND circuits II2 will be at the H voltage level, and the outputs are inverted by the second inverter circuits II3, switching all the fuse predecode logic translate signals FPC0 (0 through 3) to the L voltage level.

Table 1 is a truth table showing the relationship between the fuse predecode signals FP supplied to the logic translate circuit 50 and the fuse predecode logic translate signals FPC that are output.

TABLE 1

| INPUT | | | | OUTPUT | | | |
|---|---|---|---|---|---|---|---|
| FPi |  |  |  |  |  |  |  |
| (0) | FPi(1) | FPi(2) | FPi(3) | FPCi(0) | FPCi(1) | FPCi(2) | FPCi(3) |
| H | H | H | H | L | L | L | L |
| L | L | L | L | H | H | H | H |
| H | L | L | L | L | L | L | L |
| L | H | L | L | H | L | L | L |
| L | L | H | L | H | H | L | L |
| L | L | L | H | H | H | H | L |

In Table 1, all i's take a value of 0, 1, or 2 at the same time.

The fuse predecode signals FP supplied to the logic translate circuit 50 are translated into the fuse predecode logic translate signals FPC based on Table 1 above, and output.

For example, if the redundancy circuit 10 is inactive, that is, if all the received fuse predecode signals FP are at the H voltage level, then all the fuse predecode logic translate signals FPC that are output will be of L voltage level signals.

Figure 9:
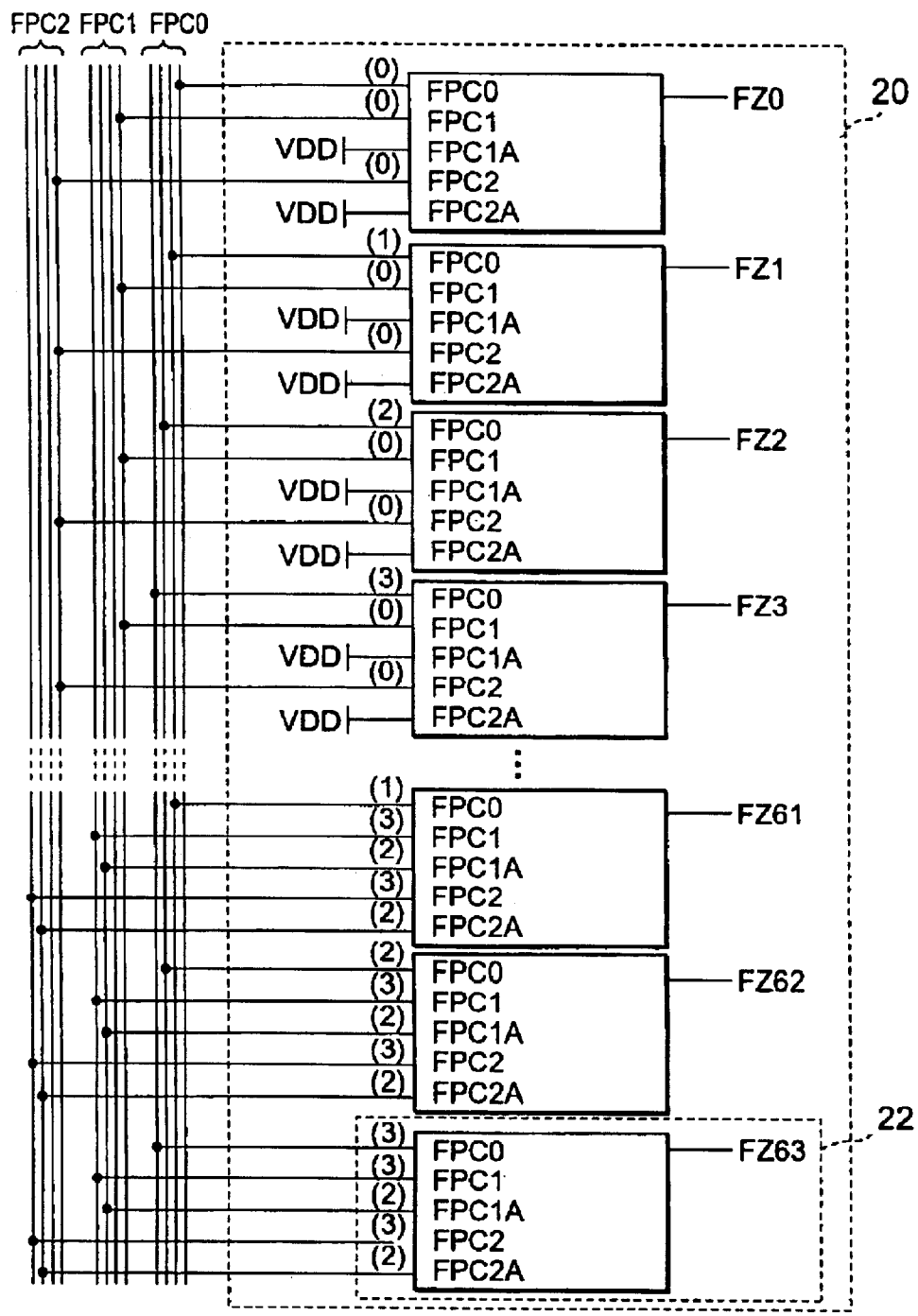
FIG. 9 is a circuit diagram illustrating a configuration example of a fuse decode circuit according to the second embodiment.

FIG. 9 and FIG. 10 illustrate a configuration example of the fuse decode circuit 20 ideally connected to the logic translate circuit 50 explained in conjunction with FIG. 8 in the second embodiment. FIG. 9 is a block diagram illustrating a connection relationship, and FIG. 10 shows a specific circuit configuration example of the fuse decode signal generating circuit 22.

There are provided the same number of the fuse predecode logic translate signal lines or buses FPC from which fuse predecode logic translate signals are output as the number of the foregoing fuse predecode signal lines. The logic translate signal lines or buses FPC are constituted by signal lines or buses arranged in the order of FPC0, FPC1, and FPC2 from the right side in FIG. 9, each bus including the same number of signal paths, namely, four signal lines carrying index numbers of (0), (1), (2), and (3) from the right in the drawing.

When the signal lines are selected one each from the signal lines FPC0, FPC1, and FPC2 to combined them, there are 64 different combinations of the signal lines. This means that the fuse decode circuit 20 has one stage for one combination, so that it has 64 stages of the fuse decode signal generating circuits 22. Each of the fuse decode signal generating circuits 22 has five input terminals and one output terminal. The fuse decode signal generating circuit 22 of the first stage has its two input terminals connected to a line voltage terminal, and its three input terminals respectively connected to one fuse predecode logic translate signal line of different buses. The connection is sequentially changed for different stages so that all the five input terminals are connected to different fuse predecode logic translate signal lines in the fuse decode signal generating circuit 22 of the last stage. For example, in the fuse decode signal generating circuit 22 of the first stage shown in FIG. 9, the output signals of individual signal lines indicated by index (0) of FPC0, index (0) of FPC1, and index (0) of FPC2 are selectablely input, and a fuse decode signal FZ0 of the first stage is output. In the fuse decode signal generating circuits 22 of the same configuration up to the last stage from the second stage, the combinations of connection are sequentially changed in an ascending order of numbers from FPC0 to FPC2 and from index number (0) to index number 3) so that the fuse predecode logic translate signals FPC are sequentially supplied to the signal generating circuits 22 of the subsequent stages from the fuse predecode logic translate signal lines in different combinations.

In addition, if the index number of the received FPC1 signal is the preceding one, namely, index number (2), then the signal of index number (1) is supplied as FPC1A to the fuse decode signal generating circuit 22. Similarly, for FPC2, the signal carrying a preceding index number is supplied as FPC2A. If a signal carrying the index number (0) is supplied as FPC1 or FPC2, then a line voltage VDD is input. The input signals thus decided are supplied to the fuse decode circuit 20 thereby to decide output signals FZ (0 through 63), which are then supplied to the address decode circuit 30.

A specific circuit configuration example of the fuse decode signal generating circuit 22 is shown in FIG. 10.

The fuse decode signal generating circuit 22 is a hybrid circuit that includes two, first and second, OR circuits III1 and III4, two NAND circuits III2 and III5, and two, first and second, inverter circuits III3 and III6.

Connected to first and second input terminals of the first OR circuit III1 are the signal lines FPC0 and FPC1 of different buses from the fuse predecode logic translate signal line or bus FPC. Connected to the first input terminal of the first NAND circuit III2 is an output signal line of the first OR circuit III1. Connected to the second input terminal thereof is a signal line FPC1A (the signal line carrying an index number preceding that of the received FPC1) from the fuse predecode logic translate signal line or bus FPC, or the line voltage VDD terminal. The output signal line of the first NAND circuit III2 is connected to the input terminal of the first inverter circuit III3. The output signal line of the first inverter circuit III3 and the signal line FPC2 of the fuse predecode logic translate signal line or bus FPC are respectively connected to the input terminals of the second OR circuit III4. The output signal line of the second OR circuit III4 and the signal line FPC2A (the signal line carrying an index number preceding that of a received FPC2) from the fuse predecode logic translate signal line or bus FPC, or the line voltage VDD terminal is connected to the input terminals of the second NAND circuit III5. The output signal line from the second NAND circuit III5 is connected to the second inverter circuit III6, and the output signal line of the second inverter circuit III6 is connected to the fuse decode signal line FZ.

The following will describe the operation of the fuse decode circuit 20 constituted by the fuse decode signal generating circuits 22 shown in FIG. 10. First, the descriptions will be given of a case where no redundancy replacement is carried out. If the redundancy circuit 10 is inactive, then all the output signals FPC from the logic translate circuits 50 are of the L voltage level. If an L voltage level signal FPC0 and an L voltage level signal FPC1 are supplied to the first OR circuit III1 from the fuse predecode logic translate signal line or bus FPC, then the first OR circuit III1 outputs an L level voltage signal. If the output signal L of the first OR circuit III1 and the voltage signal of the L voltage level (or of the H voltage level of the line voltage VDD) of the signal FPC1A from the fuse predecode logic translate signal line or bus FPC are supplied to the first NAND circuit III2, then the first NAND circuit III2 outputs an H level voltage signal. The output signal H is inverted by the first inverter circuit III3 into an L voltage level signal. If the output signal L of the first inverter circuit III3 and an L voltage level output signal, which is the FPC2 signal of the fuse predecode logic translate signal lines or buses FPC, are supplied to the second OR circuit III4, then the second OR circuit III4 issues an L voltage level output signal. If the output signal L and the output signal of the L voltage level (or of the H voltage level of the line voltage VDD) of the signal FPC2A from the fuse predecode logic translate signal line or bus FPC are supplied to the second NAND circuit III5, then the second NAND circuit III5 issues an H voltage level output signal. The output signal H is inverted by the second inverter circuit III6. As a result, all signal lines FZ (0 through 63) are set to the L voltage level.

When an X address is defined, the redundancy circuit is activated, and all the fuse predecode logic translate signal lines or buses FPC output H voltage level signals. If an H voltage level signal FPC0 and an H voltage level signal FPC1 are supplied to the first OR circuit III1 from the fuse predecode logic translate signal line or bus FPC, then the first OR circuit III1 outputs an H voltage level signal. If the output signal H of the first OR circuit III1 and the H voltage level signal FPC1A from the fuse predecode logic translate signal line or bus FPC are supplied to the first NAND circuit III2, then the first NAND circuit III2 outputs an L level voltage signal. The output signal L is inverted by the first inverter circuit III3 into an H voltage level signal. If the output signal H of the first inverter circuit III3 and an H voltage level output signal, which is the FPC2 signal of the fuse predecode logic translate signal lines or buses FPC, are supplied to the second OR circuit III4, then the second OR circuit III4 outputs a signal of the H voltage level. If the output signal H of the second OR circuit III4 and the H voltage level signal of the signal FPC2A from the fuse predecode logic translate signal line or bus FPC are supplied to the second NAND circuit III5, then the second NAND circuit III5 outputs an L voltage level signal. The output signal L is inverted by the second inverter circuit III6, and the voltage level of the fuse decode signal line FZ is switched to the H level. As a result, the H voltage level signals are output to all the fuse decode signal lines FZ. Hence, no connection shift is carried out in the column decoder in the address decode circuit 30 shown in FIG. 7, so that the spare address decode signal line RDEC is not selected and therefore no redundant memory cell is used.

The operation for carrying out redundancy replacement will now be described. The descriptions will be given of an example of redundancy replacement in which the address decode signal line DEC63 shown in FIG. 6 is unselected and shifted, and a signal is output to a spare signal line RDEC instead.

When the redundancy circuit 10 is inactive, all the fuse predecode logic translate signals FPC are at the L voltage level. When an X address is defined, only the fuse predecode signals FP, namely, FP0 (3), FP1 (3), and FP2 (3), that correspond to cut-off fuses F (F00, F10, and F20 in this case) maintain the H voltage level, while all the remaining signals FP are switched to the L voltage level. As soon as these FP signals are supplied to the logic translate circuit 50, FPC to which the H voltage level FP signals have been supplied, namely, FPC0 (3), FPC1 (3), and FPC2 (3) in this case, and the FPC carrying greater index numbers output L voltage level signals, while all the remaining FPC output H voltage level signals according to the truth table of Table 1. The index number in this example is the greatest; therefore, there are no other FPC outputting the L voltage level signals.

These FPC signals are supplied to the fuse decode circuit 20 shown in FIG. 9 and FIG. 10. This causes an L voltage level signal to be output only to the fuse decode signal line FZn, namely, FZ63 in this case, while an H voltage level signal is output to FZ (0 through n−1), namely, FZ (0 through 62) in this case, if it has been programmed to replace a decoder of an n-th stage. These output signals are supplied to a column decoder of the address decode circuit 30.

The column decoder to which the L voltage level signal has been supplied unselects an address decode signal line DECn (DEC63 in this case), and selects DEC (n+1) instead. This causes the subsequent adjoining column decoders to shift by one in selecting the signal lines. As a result, the column decoder in the last stage selects the spare signal line RDEC, so that a redundant memory cell is used.

The second embodiment provides the advantage of a dramatically reduced time required for the redundancy replacement operation to be completed after a defined X address is supplied to the redundancy circuit, in addition to the advantages obtained by the combinations of the exemplary configurations according to the first embodiment. More specifically, according to the first embodiment, the redundancy replacement takes longer to be completed since the fuse decode signals are input to FZ0 through FZ63 in order in such a manner that a preceding signal indicating a decision is supplied to the following stage to decide the next output signal, meaning that signals have to be transmitted through all the stages in sequence.

According to the second embodiment, the fuse predecode logic translate signals FPC that have been subjected to logic translation are directly and simultaneously supplied to the fuse decode circuit where they are processed without waiting for the signal of the preceding stage to be processed. Thus, outputting a fuse decode signal takes only the time required for the transmission through four logic stages. The result is the dramatically increased speed of the redundancy replacement operation.

The redundancy circuit of a semiconductor memory device in accordance with the present invention has fuses in a fuse predecode circuit thereof, and the layout pitch in an address decode circuit is not dependent on the size or number fuses. This feature enables the redundancy circuit to successfully accommodate to smaller memory cells involved in the microprocessing in the manufacture of semiconductor memory devices in the future. Accordingly, even when memory cells become even smaller, the redundancy circuit in a semiconductor memory device in accordance with the present invention will not cause an increased area of a chip.

Moreover, the total number of fuses that are disposed in a fuse predecode circuit and conventionally required to match the number of the combinations of programs can be significantly reduced. This makes it possible to markedly reduce the area occupied by the redundancy circuit of the semiconductor memory device in accordance with the present invention, as compared with prior art.

The configurations of the redundancy circuit of the semiconductor memory device in accordance with the present invention permits easy setting of a greater degree of freedom; hence, more defective memory cells can be saved at more detailed levels. This feature leads to a dramatically improved yield of products.

What is claimed is:

1. A semiconductor memory device including a redundancy circuit, the redundancy circuit comprising:
   a fuse predecode signal bus including a plurality of predecode signal lines;
   a fuse predecode circuit connected to the fuse predecode signal bus for receiving a plurality of first address signals, the fuse predecode circuit including,
      a plurality of drivers each of which generates a drive signal in response to one of the first address signals,
      a plurality of terminal circuits connected to the predecode signal bus, the terminal circuits latching signals appeared on the predecode signal bus, and
      a plurality of fuse circuits each of which is connected between one of the predecode signal lines and a first potential source, each of the fuse circuits including a transistor having a control terminal connected to one of the drivers and a fuse connected to the transistor in series;
   a fuse decode circuit connected to the fuse predecode signal bus, the fuse decode circuit decoding signals appeared on the fuse predecode signal bus and outputting a decode signal; and
   an address decode circuit connected to the fuse decode circuit, the address decode signal generating an address decode signal in response to a plurality of second address signals and the decode signal.

2. A semiconductor memory device according to claim 1, wherein each of the transistors of the fuse circuits has a first terminal connected to one of the predecode signal lines and a second terminal, and wherein each of the fuse of the fuse circuits has a first terminal connected to the second terminal of the transistor and a second terminal connected to the first potential source.

3. A semiconductor memory device according to claim 1, wherein each of the transistors of the fuse circuits has a first terminal connected to the first potential source and a second terminal, and wherein each of the fuse of the fuse circuits has a first terminal connected to the second terminal of the transistor and a second terminal connected to one of the predecode signal lines.

4. A semiconductor memory device according to claim 1, wherein the fuse decode circuit includes a plurality of first gate circuits each of which has a plurality of input terminals connected to one of the predecode signal lines, respectively.

5. A semiconductor memory device according to claim 4, wherein the fuse decode circuit further includes a plurality of second gate circuits each of which has a plurality of input terminals connected to one of output terminal of the first gate circuit and an output terminal of the next second gate terminal.

6. A semiconductor memory device according to claim 4, wherein fuse decode circuit further includes
   a driver circuit generating a drive signal and an inverted drive signal,
   a plurality of first transistors each of which has a source connected to a second voltage source, a gate connected to receive the inverted drive signal and a drain,
   a plurality of second transistors connected in series to for a pass for transferring the drive signal, each of the second transistor having a drain connected to the drain of one of the first transistors, a gate connected to one of the output terminals of the first gate circuits and a source,
   a plurality of inverters each having an input terminal connected to one of the drains of the first transistors and an output terminal,
   a plurality of third transistors each of which has a source connected to the first potential source, a gate connected to one of the output terminals of the inverters and a drain,
   a plurality of fourth transistors each of which has a source connected to the drain of one of the third transistors, a gate connected to one of the output terminal of the first gate circuit and a drain connected to one of the drain of one of the second transistors.

7. A semiconductor memory device including a redundancy circuit, the redundancy circuit comprising:
   a fuse predecode signal bus including a plurality of predecode signal lines;
   a fuse predecode circuit connected to the fuse predecode signal bus for receiving a plurality of first address signals, the fuse predecode circuit including,
      a plurality of drivers each of which generates a drive signal in response to one of the first address signals,
      a plurality of terminal circuits connected to the predecode signal bus, the terminal circuits latching signals appeared on the predecode signal bus, and
      a plurality of fuse circuits each of which is connected between one of the predecode signal lines and a first potential source, each of the fuse circuits including a transistor having a control terminal connected to one of the drivers and a fuse connected to the transistor in series;
   a logic translate circuit connected to the fuse predecode signal bus, the logic translate circuit translating signals output from the fuse predecode circuit and outputting translated signals;
   a fuse decode circuit connected to the logic translate circuit, the fuse decode circuit decoding the translated signals and outputting a decode signal; and
   an address decode circuit connected to the fuse decode circuit, the address decode signal generating an address decode signal in response to a plurality of second address signals and the decode signal.

8. A semiconductor memory device according to claim 7, wherein each of the transistors of the fuse circuits has a first terminal connected to one of the predecode signal lines and a second terminal, and wherein each of the fuse of the fuse circuits has a first terminal connected to the second terminal of the transistor and a second terminal connected to the first potential source.

9. A semiconductor memory device according to claim 7, wherein each of the transistors of the fuse circuits has a first terminal connected to the first potential source and a second terminal, and wherein each of the fuse of the fuse circuits has a first terminal connected to the second terminal of the transistor and a second terminal connected to one of the predecode signal lines.

10. A semiconductor memory device according to claim 7, wherein the logic translate circuit includes a plurality of first gate circuits each of which has an output terminal, a first input terminals connected to one of the predecode signal lines and a second terminal connected to the output terminal of the next first gate circuit.

11. A semiconductor memory device according to claim 7, wherein the fuse decode circuit further includes a plurality of gate circuits.

12. A redundancy circuit comprising:
   a plurality of predecode signal lines;

a fuse predecode circuit connected to the fuse predecode signal lines for receiving a plurality of first address signals, the fuse predecode circuit including,
   a plurality of drivers each of which generates a drive signal in response to one of the first address signals,
   a plurality of terminal circuits connected to the predecode signal bus, the terminal circuits latching signals appeared on the predecode signal lines, and
   a plurality of fuse circuits each of which is connected between one of the predecode signal lines and a first potential source, each of the fuse circuits including a transistor having a control terminal connected to one of the drivers and a fuse connected to the transistor in series;
a fuse decode circuit connected to the fuse predecode signal lines, the fuse decode circuit decoding signals appeared on the fuse predecode signal lines and outputting a decode signal; and
an address decode circuit connected to the fuse decode circuit, the address decode signal generating an address decode signal in response to a plurality of second address signals and the decode signal.

13. A redundancy circuit according to claim 12, wherein each of the transistors of the fuse circuits has a first terminal connected to one of the predecode signal lines and a second terminal, and wherein each of the fuse of the fuse circuits has a first terminal connected to the second terminal of the transistor and a second terminal connected to the first potential source.

14. A redundancy circuit according to claim 12, wherein each of the transistors of the fuse circuits has a first terminal connected to the first potential source and a second terminal, and wherein each of the fuse of the fuse circuits has a first terminal connected to the second terminal of the transistor and a second terminal connected to one of the predecode signal lines.

15. A redundancy circuit according to claim 12, wherein the fuse decode circuit includes a plurality of first gate circuits each of which has a plurality of input terminals connected to one of the predecode signal lines, respectively.

16. A redundancy circuit according to claim 15, wherein the fuse decode circuit further includes a plurality of second gate circuits each of which has a plurality of input terminals connected to one of output terminal of the first gate circuit and an output terminal of the next second gate terminal.

17. A redundancy circuit according to claim 15, wherein fuse decode circuit further includes
   a driver circuit generating a drive signal and an inverted drive signal,
   a plurality of first transistors each of which has a source connected to a second voltage source, a gate connected to receive the inverted drive signal and a drain,
   a plurality of second transistors connected in series to for a pass for transferring the drive signal, each of the second transistor having a drain connected to the drain of one of the first transistors, a gate connected to one of the output terminals of the first gate circuits and a source,
   a plurality of inverters each having an input terminal connected to one of the drains of the first transistors and an output terminal,
   a plurality of third transistors each of which has a source connected to the first potential source, a gate connected to one of the output terminals of the inverters and a drain,
   a plurality of fourth transistors each of which has a source connected to the drain of one of the third transistors, a gate connected to one of the output terminal of the first gate circuit and a drain connected to one of the drain of one of the second transistors.

* * * * *